United States Patent
Tseng et al.

(10) Patent No.: US 11,031,342 B2
(45) Date of Patent: Jun. 8, 2021

(54) SEMICONDUCTOR PACKAGE AND METHOD

(71) Applicant: Taiwan Semiconductor Manufacturing Company, Ltd., Hsinchu (TW)

(72) Inventors: Shih-Hao Tseng, Hsinchu (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 15/925,174

(22) Filed: Mar. 19, 2018

(65) Prior Publication Data

US 2019/0148302 A1     May 16, 2019

Related U.S. Application Data

(60) Provisional application No. 62/586,314, filed on Nov. 15, 2017.

(51) Int. Cl.
*H01L 21/3105*     (2006.01)
*H01L 21/311*     (2006.01)
(Continued)

(52) U.S. Cl.
CPC ........ *H01L 23/5386* (2013.01); *H01L 21/288* (2013.01); *H01L 21/31058* (2013.01); *H01L 21/31138* (2013.01); *H01L 21/561* (2013.01); *H01L 21/565* (2013.01); *H01L 21/6835* (2013.01); *H01L 21/7684* (2013.01); *H01L 21/76802* (2013.01); *H01L 21/76871* (2013.01);
(Continued)

(58) Field of Classification Search
CPC . H01L 23/5386; H01L 23/3107; H01L 21/56; H01L 21/565; H01L 24/20; H01L 24/19; H01L 2224/96; H01L 2224/18; H01L 23/5384
See application file for complete search history.

(56) References Cited

U.S. PATENT DOCUMENTS 5,277,756 A *    1/1994    Dion .................... C23F 1/38
                                                      438/754
8,361,842 B2     1/2013    Yu et al.
(Continued)

FOREIGN PATENT DOCUMENTS

CN        103681367 A     3/2014
CN        106057760 A     10/2016
(Continued)

*Primary Examiner* — Mary A Wilczewski
(74) *Attorney, Agent, or Firm* — Slater Matsil, LLP

(57) ABSTRACT

In an embodiment, a device includes: an integrated circuit die; a through via adjacent the integrated circuit die; a molding compound encapsulating the integrated circuit die and the through via; and a redistribution structure including: a first conductive via extending through a first dielectric layer, the first conductive via electrically connected to the integrated circuit die, the first dielectric layer being over the integrated circuit die, the through via, and the molding compound; and a first conductive line over the first dielectric layer and the first conductive via, the first conductive via extending into the first conductive line.

20 Claims, 18 Drawing Sheets

(51) Int. Cl.
   *H01L 21/56*    (2006.01)
   *H01L 21/768*   (2006.01)
   *H01L 23/31*    (2006.01)
   *H01L 23/538*   (2006.01)
   *H01L 23/00*    (2006.01)
   *H01L 21/288*   (2006.01)
   *H01L 21/683*   (2006.01)
   *H01L 21/321*   (2006.01)
   *H01L 25/10*    (2006.01)

(52) U.S. Cl.
   CPC .... *H01L 21/76877* (2013.01); *H01L 23/3107* (2013.01); *H01L 23/5383* (2013.01); *H01L 23/5384* (2013.01); *H01L 23/5389* (2013.01); *H01L 24/05* (2013.01); *H01L 24/19* (2013.01); *H01L 24/20* (2013.01); *H01L 24/24* (2013.01); *H01L 21/3212* (2013.01); *H01L 23/3128* (2013.01); *H01L 25/105* (2013.01); *H01L 2221/68345* (2013.01); *H01L 2221/68359* (2013.01); *H01L 2224/0231* (2013.01); *H01L 2224/02373* (2013.01); *H01L 2224/0401* (2013.01); *H01L 2224/05124* (2013.01); *H01L 2224/05569* (2013.01); *H01L 2224/05573* (2013.01); *H01L 2224/24137* (2013.01); *H01L 2225/1023* (2013.01); *H01L 2225/1058* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,059,107 | B2 * | 6/2015 | Pan ................. H01L 21/56 |
| 9,461,018 | B1 * | 10/2016 | Tsai ............... H01L 21/4857 |
| 9,646,955 | B2 * | 5/2017 | Yu ................... H01L 24/09 |
| 9,666,520 | B2 * | 5/2017 | Yu ................ H01L 21/76897 |
| 9,691,706 | B2 * | 6/2017 | Yu .................. H01L 23/5389 |
| 9,711,458 | B2 * | 7/2017 | Yu .................. H01L 23/5386 |
| 9,728,498 | B2 | 8/2017 | Su et al. |
| 9,837,359 | B1 * | 12/2017 | Chiu ................ H01L 23/5389 |
| 9,847,269 | B2 | 12/2017 | Lin et al. |
| 9,852,995 | B1 * | 12/2017 | Mori ............... H01L 21/4853 |
| 9,911,718 | B2 * | 3/2018 | Prabhu .............. H01L 21/54 |
| 9,997,464 | B2 | 6/2018 | Hsieh et al. |
| 10,043,779 | B2 * | 8/2018 | Prabhu ............ H01L 21/4853 |
| 10,157,862 | B1 * | 12/2018 | Chen ............... H01L 21/6835 |
| 10,170,341 | B1 * | 1/2019 | Lin ................. H01L 23/3128 |
| 10,446,522 | B2 | 10/2019 | Lin et al. |
| 10,510,673 | B2 * | 12/2019 | Hu .................. H01L 23/5383 |
| 2004/0106219 | A1 | 6/2004 | Yoshida et al. |
| 2005/0029642 | A1 | 2/2005 | Takaya et al. |
| 2007/0069363 | A1 | 3/2007 | Kawabata et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0187270 | A1 * | 7/2013 | Yu ..................... H01L 25/50 257/737 |
| 2013/0221530 | A1 | 8/2013 | Miyata et al. |
| 2013/0307140 | A1 | 11/2013 | Huang et al. |
| 2014/0110856 | A1 | 4/2014 | Lin |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0262909 | A1 | 9/2015 | Chen |
| 2015/0318246 | A1 * | 11/2015 | Yu ................... H01L 25/065 257/774 |
| 2015/0348904 | A1 | 12/2015 | Huang et al. |
| 2016/0276278 | A1 * | 9/2016 | Tsai ............... H01L 21/4857 |
| 2016/0307872 | A1 * | 10/2016 | Chen .............. H01L 21/486 |
| 2016/0315051 | A1 * | 10/2016 | Lin ................ H01L 21/565 |
| 2017/0025322 | A1 * | 1/2017 | Tsai ............... H01L 23/3171 |
| 2017/0032977 | A1 | 2/2017 | Chen et al. |
| 2017/0062383 | A1 | 3/2017 | Yee et al. |
| 2017/0062391 | A1 | 3/2017 | Chen et al. |
| 2017/0141042 | A1 * | 5/2017 | Prabhu ............ H01L 21/4853 |
| 2017/0141083 | A1 * | 5/2017 | Prabhu ............. H01L 23/481 |
| 2017/0154858 | A1 * | 6/2017 | Tsai ............... H01L 23/49816 |
| 2017/0154870 | A1 * | 6/2017 | Chen .............. H01L 23/3114 |
| 2017/0287845 | A1 | 10/2017 | Huang et al. |
| 2017/0316989 | A1 * | 11/2017 | Tsai ................... G01R 31/00 |
| 2017/0317029 | A1 * | 11/2017 | Hsieh ............... H01L 25/105 |
| 2017/0317038 | A1 * | 11/2017 | Tsai ............... H01L 23/552 |
| 2017/0323853 | A1 * | 11/2017 | Hu ................. H01L 23/5384 |
| 2017/0345764 | A1 * | 11/2017 | Chang ............ H01L 23/49811 |
| 2017/0352626 | A1 * | 12/2017 | Lin ................ H01L 21/565 |
| 2018/0019209 | A1 * | 1/2018 | Chang .............. H01L 25/50 |
| 2018/0026010 | A1 * | 1/2018 | Huang .............. H01L 23/5382 257/659 |
| 2018/0047674 | A1 * | 2/2018 | Tsai ............... H01L 23/5384 |
| 2018/0061767 | A1 * | 3/2018 | Chiang ........... H01L 23/49811 |
| 2018/0061773 | A1 * | 3/2018 | Conklin ........... H01L 23/544 |
| 2018/0061776 | A1 * | 3/2018 | Yang ................ H01L 24/97 |
| 2018/0061805 | A1 * | 3/2018 | Fang ............... H01L 21/4853 |
| 2018/0090445 | A1 * | 3/2018 | Chang ............. H01L 25/105 |
| 2018/0090465 | A1 * | 3/2018 | Chen ................ H01L 21/78 |
| 2018/0096942 | A1 * | 4/2018 | Chiu ................ H01L 23/5384 |
| 2018/0096943 | A1 * | 4/2018 | Chiu ................ H01L 23/5386 |
| 2018/0130761 | A1 * | 5/2018 | Kim ................. H01L 23/5389 |
| 2018/0138126 | A1 * | 5/2018 | Chen ................ H01L 24/13 |
| 2018/0151500 | A1 * | 5/2018 | Chen ................ H01L 25/105 |
| 2018/0166396 | A1 * | 6/2018 | Lee ................. H01L 21/3043 |
| 2018/0218953 | A1 * | 8/2018 | Tsai ................... G01R 31/00 |
| 2018/0294228 | A1 * | 10/2018 | Hsieh ............... H01L 21/565 |
| 2018/0366411 | A1 * | 12/2018 | Suk ................. H01L 21/4864 |
| 2018/0374797 | A1 * | 12/2018 | Hu .................. H01L 21/4853 |
| 2019/0006199 | A1 * | 1/2019 | Tsou ................ H01L 21/486 |
| 2019/0006283 | A1 * | 1/2019 | Wang .............. H01L 21/6835 |
| 2019/0006314 | A1 * | 1/2019 | Jeng ................ H01L 21/4857 |
| 2019/0027446 | A1 * | 1/2019 | Cheng ............. H01L 21/4853 |
| 2019/0035737 | A1 * | 1/2019 | Wu .................. H01L 21/4875 |
| 2019/0096816 | A1 * | 3/2019 | Ho ................... H01L 21/78 |
| 2019/0096823 | A1 * | 3/2019 | Fang ................ H01L 21/4853 |
| 2019/0139897 | A1 * | 5/2019 | Liang ............... H01Q 21/065 |
| 2019/0148302 | A1 * | 5/2019 | Tseng .............. H01L 23/5386 257/774 |
| 2019/0157209 | A1 * | 5/2019 | Wang .............. H01L 25/50 |
| 2019/0252352 | A1 * | 8/2019 | Chen ............... H01L 21/565 |
| 2019/0295955 | A1 * | 9/2019 | Hsieh .............. H01L 21/486 |
| 2019/0312003 | A1 | 10/2019 | Takeuchi ......... H01L 24/19 |
| 2019/0333862 | A1 * | 10/2019 | Wang ............... H01L 21/568 |
| 2019/0333869 | A1 * | 10/2019 | Teng ............... H01L 23/5389 |
| 2019/0341360 | A1 * | 11/2019 | Yu .................. H01L 23/5389 |
| 2019/0341363 | A1 * | 11/2019 | Yu .................. H01L 21/568 |
| 2019/0385951 | A1 * | 12/2019 | Chu ................. H01L 23/5386 |
| 2019/0393171 | A1 * | 12/2019 | Liao ................ H01P 3/16 |
| 2020/0006089 | A1 * | 1/2020 | Yu ................... H01L 21/6835 |
| 2020/0083189 | A1 * | 3/2020 | Chen ................ H01L 21/4853 |
| 2020/0091091 | A1 * | 3/2020 | Teng ............... H01L 23/5386 |
| 2020/0105675 | A1 * | 4/2020 | Yu .................. H01L 23/5226 |

FOREIGN PATENT DOCUMENTS

| | | |
|---|---|---|
| CN | 106328602 A | 1/2017 |
| CN | 106409782 A | 2/2017 |
| CN | 107342277 A | 11/2017 |
| KR | 100365936 B1 | 12/2002 |
| KR | 20170015052 A | 2/2017 |
| TW | 201737428 A | 10/2017 |

\* cited by examiner

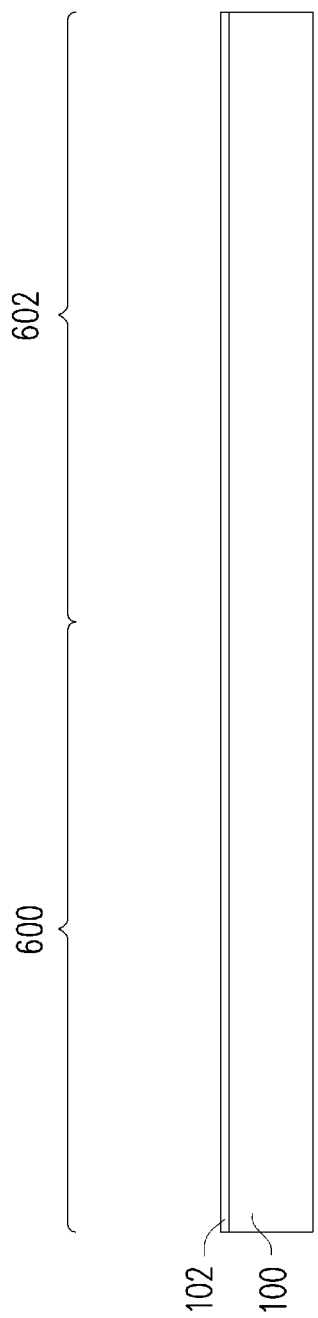
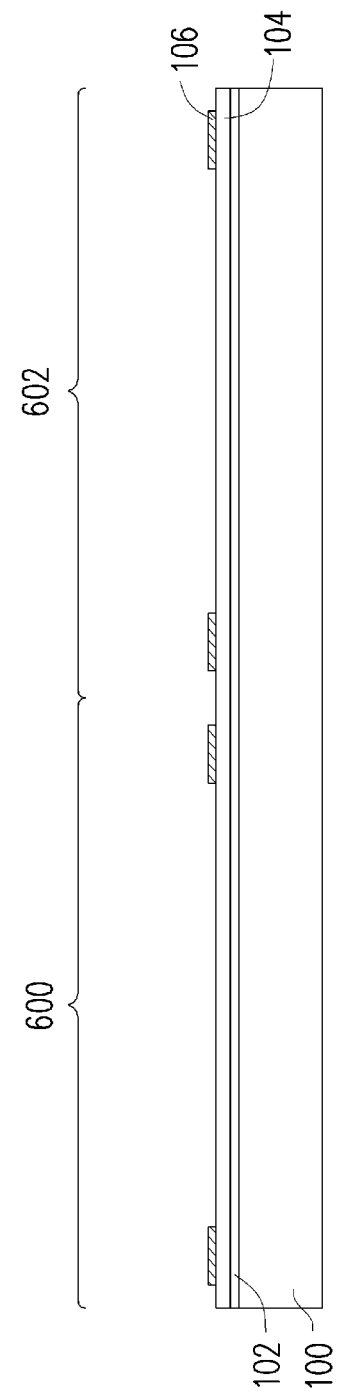

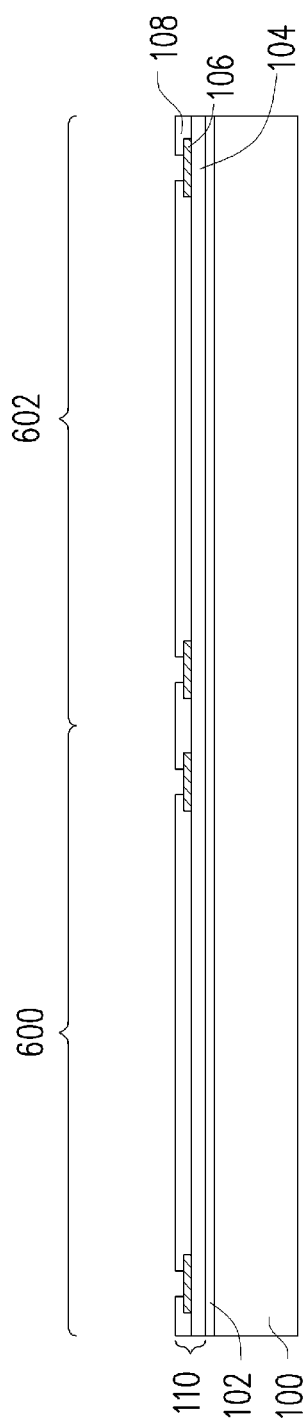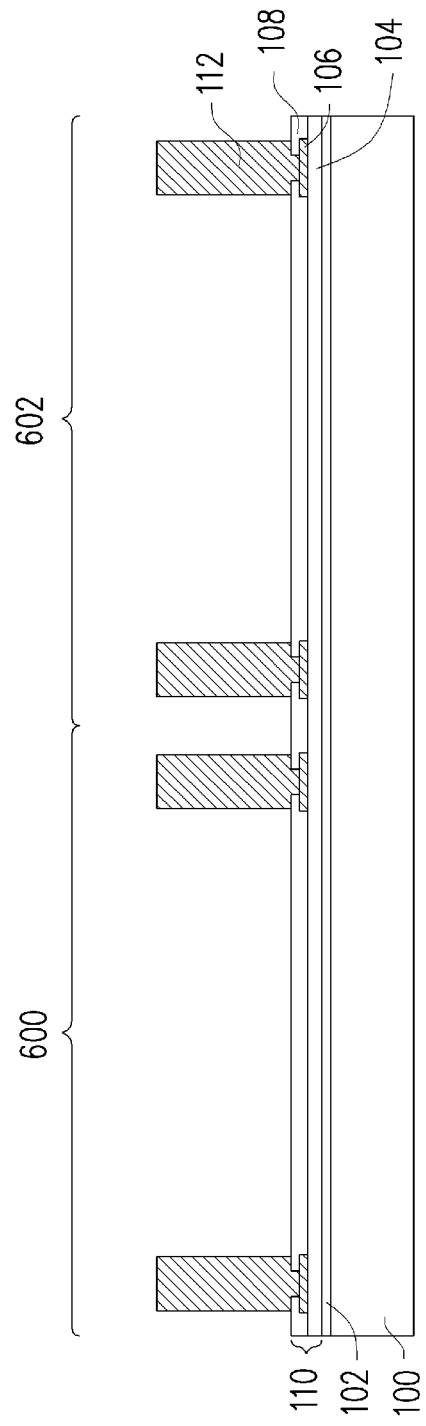

SEMICONDUCTOR PACKAGE AND METHOD

PRIORITY CLAIM AND CROSS-REFERENCE

This application claims the benefits of U.S. Provisional Application Ser. No. 62/586,314, filed on Nov. 15, 2017, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 16 illustrate cross-sectional views of intermediate steps during a process for forming device packages, in accordance with some embodiments.

DETAILED DESCRIPTION

Figure 5:
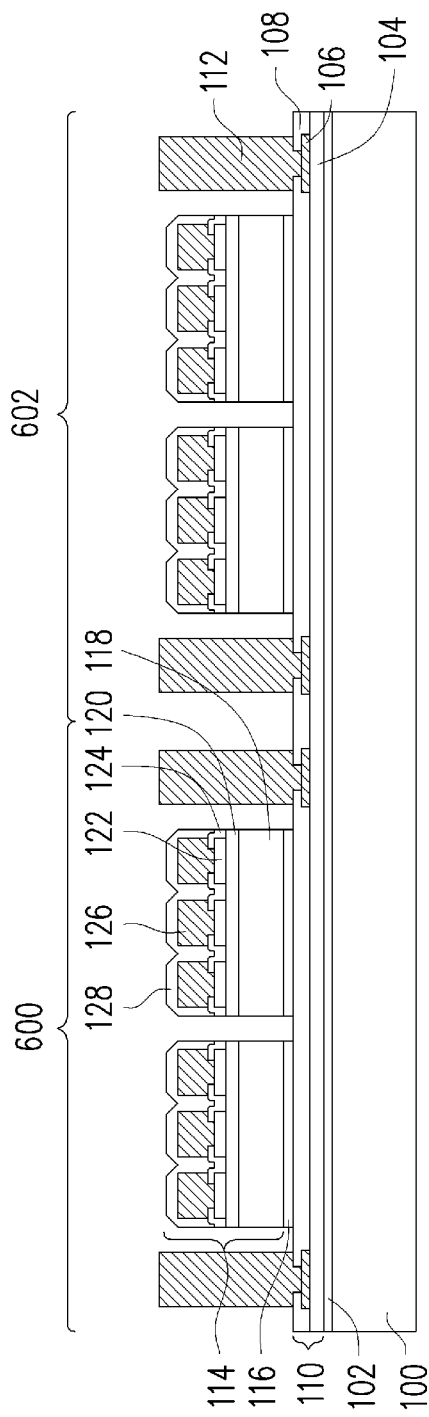

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) having a fine-pitch front-side redistribution structure. Vias of the front-side redistribution structure are formed having an anchor connection with an overlying metallization pattern. In an anchor connection, a via extends partially into the overlying metallization pattern, and the overlying metallization pattern does not have recesses over the via. Forming vias with an anchor connection may avoid the formation of blind vias, e.g., vias that are not fully exposed through the respective dielectric layer. Further, the anchor connection may have better mechanical strength.

The teachings of this disclosure are applicable to any package structure including redistribution structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 16 illustrate cross-sectional views of intermediate steps during a process for forming first packages 200, in accordance with some embodiments. A first package region 600 and a second package region 602 are illustrated, and a first package 200 is formed in each package region. The first packages 200 may also be referred to as integrated fan-out (InFO) packages.

In FIG. 1, a carrier substrate 100 is provided, and a release layer 102 is formed on the carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

In FIG. 2, a dielectric layer 104 and a metallization pattern 106 (sometimes referred to as redistribution layers or redistribution lines) is formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization pattern 106 may be referred to as a back-side redistribution structure 110. In the embodiment shown, the back-side redistribution structure 110 includes the two dielectric layers 104 and 108 and one metallization pattern 106. In other embodiments, the back-side redistribution structure 110 can include any number of dielectric layers, metallization patterns, and conductive vias. One or more additional metallization pattern and dielectric layer may be formed in the back-side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

In FIG. 4, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 112.

In FIG. 5, integrated circuit dies 114 are adhered to the dielectric layer 108 by an adhesive 116. Although two integrated circuit dies 114 are illustrated as being adhered in each of the first package region 600 and the second package region 602, it should be appreciated that more or less integrated circuit dies 114 may be adhered in each package region. For example, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back-sides of the integrated circuit dies 114 and adheres the integrated circuit dies 114 to the back-side redistribution structure 110, such as the dielectric layer 108. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 6:
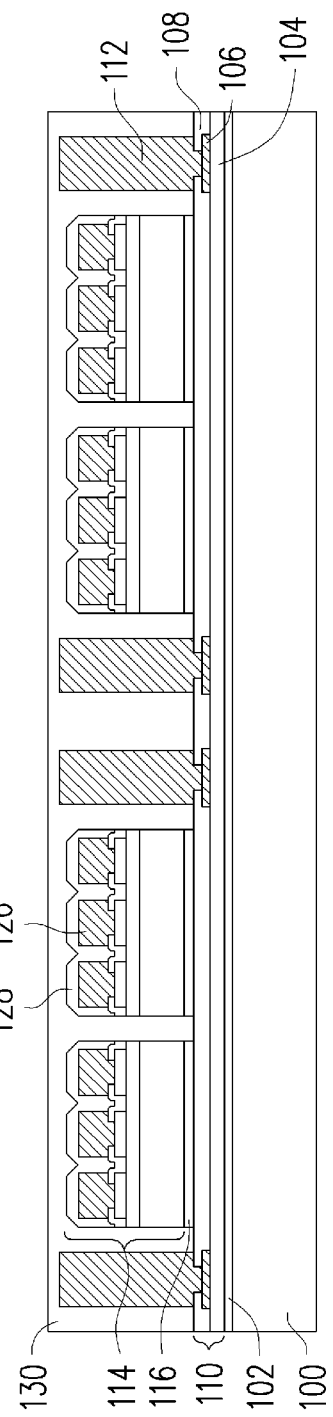

In FIG. 6, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such that the through vias 112 and/or the die connectors 126 of the integrated circuit dies 114 are buried or covered. The encapsulant 130 is then cured.

Figure 7:
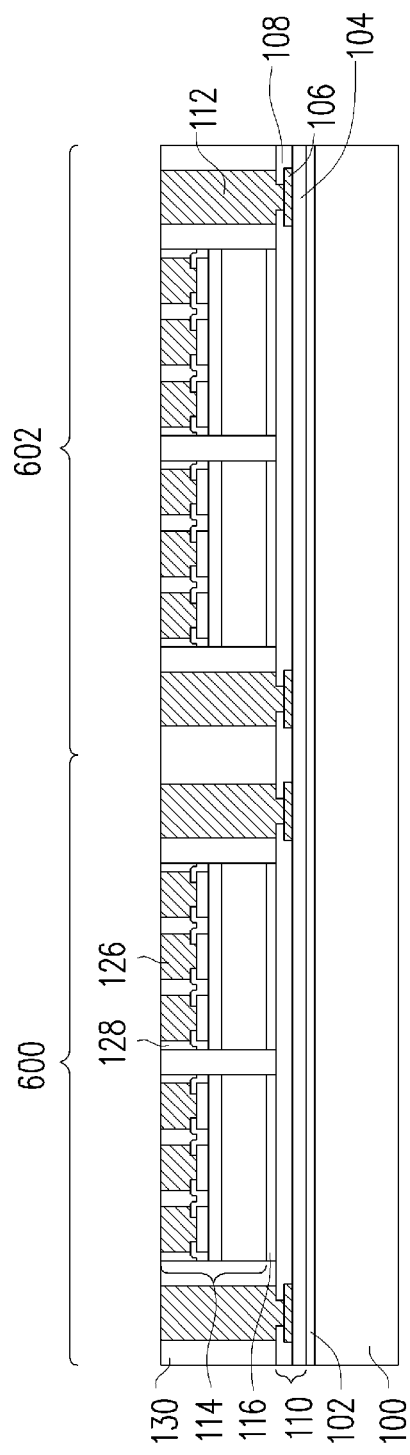

In FIG. 7, a planarization process is performed on the encapsulant 130 to expose the through vias 112 and the die connectors 126. The planarization process may also grind the dielectric material 128. Top surfaces of the through vias 112, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 112 and die connectors 126 are already exposed.

In FIGS. 8 through 13, a front-side redistribution structure 132 is formed. As will be illustrated, the front-side redistribution structure 132 includes dielectric layers 136, 148, 164, 170, and also includes metallization patterns. The metallization patterns may also be referred to as redistribution layers or redistribution lines, and include conductive vias 134, 146, 162, 168, and conductive lines 144, 160, 166. Because the front-side redistribution structure 132 is a fine-pitch redistribution structure, the conductive lines 144, 160, 166 may have a pitch between adjacent lines of about 1 µm or less, and the conductive lines 144, 160, 166 may have an average width of about 1 µm or less.

Figure 8:
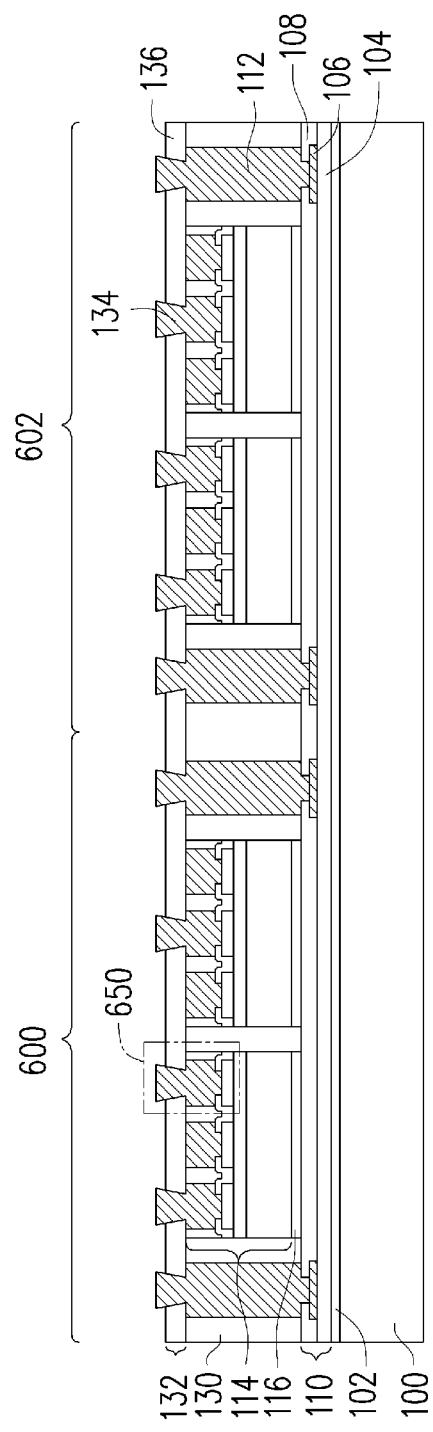

In FIG. 8, the conductive vias 134 are formed electrically connected to, e.g., the through vias 112 and/or the die connectors 126. A dielectric layer 136 is then deposited on and around the conductive vias 134, and on the encapsulant 130, through vias 112, and die connectors 126. FIGS. 9A through 9D are cross-sectional views illustrating more details of a region 650 during a process for forming the conductive vias 134 and dielectric layer 136.

Figure 9A:
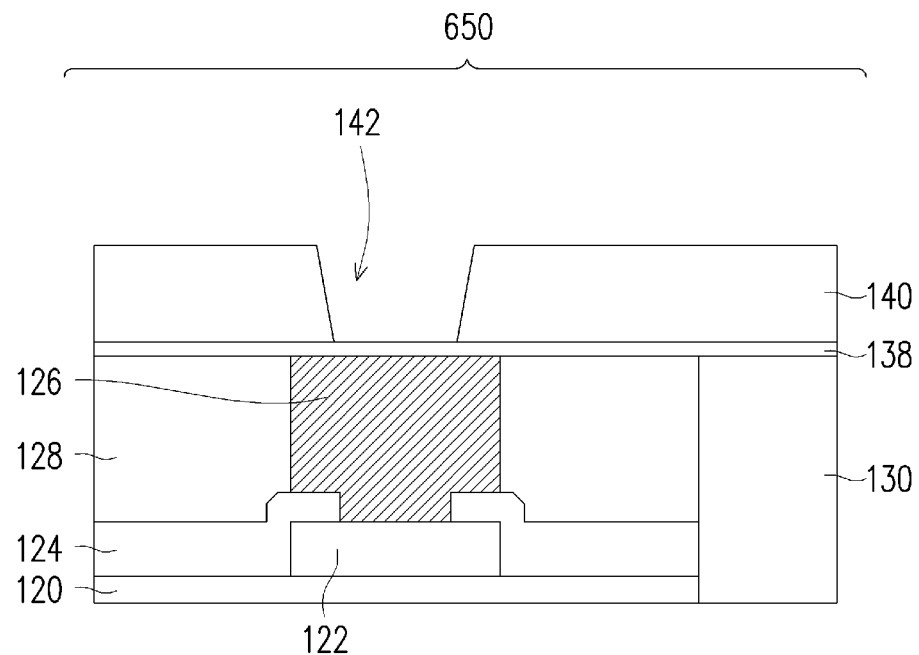

In FIG. 9A, a seed layer 138 is formed on the encapsulant 130, through vias 112, die connectors 126, and dielectric material 128. In some embodiments, the seed layer 138 is a metal layer, which may be a single layer or a composite layer comprising a plurality of sub-layers formed of different materials. In some embodiments, the seed layer 138 comprises a titanium layer and a copper layer over the titanium layer. The seed layer 138 may be formed using, for example, PVD or the like. A mask layer 140 is formed and patterned on the seed layer 138. The mask layer 140 may be a photo resist, such as a single-layer photo resist, tri-layer photo resist, or the like. The mask layer 140 may be formed by spin coating or the like and may be exposed to light for patterning. The pattern of the mask layer 140 corresponds to through vias. The patterning forms openings 142 through the mask layer 140 to expose the seed layer 138.

Figure 9B:
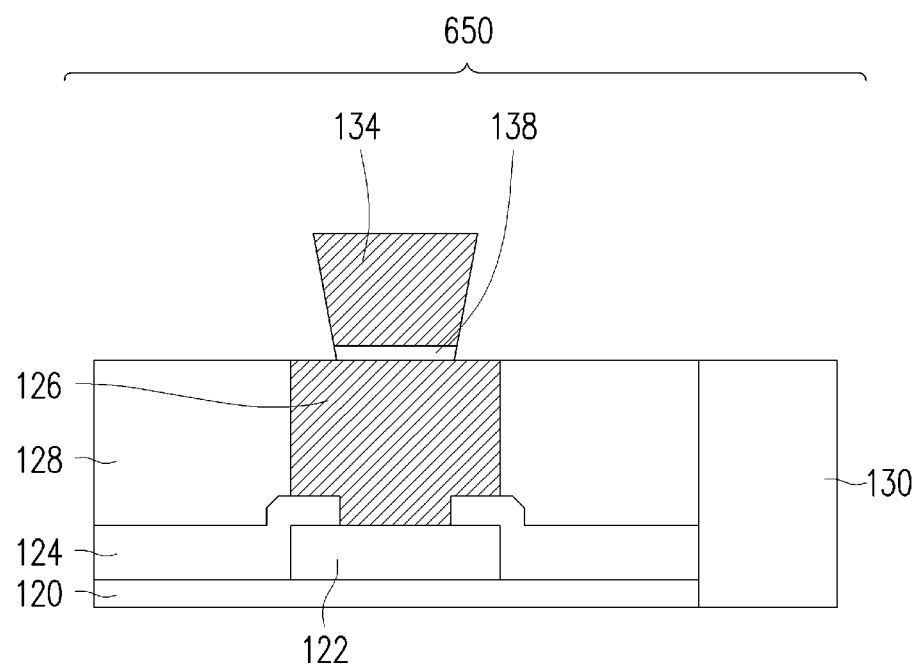

In FIG. 9B, a conductive material is formed in the openings 142 of the mask layer 140 and on the exposed portions of the seed layer 138. The conductive material may be formed by plating, such as electroplating or electroless plating, or the like. The conductive material may comprise a metal, like copper, titanium, tungsten, aluminum, or the like. The mask layer 140 and portions of the seed layer 138 on which the conductive material is not formed are removed. In embodiments where the mask layer 140 is a photo resist, it may be removed by an acceptable ashing or stripping process, such as using an oxygen plasma or the like. Once the mask layer 140 is removed, exposed portions of the seed layer 138 are removed, such as by using an acceptable etching process, such as by wet or dry etching. The remaining portions of the seed layer 138 and conductive material form the conductive vias 134.

Figure 9C:
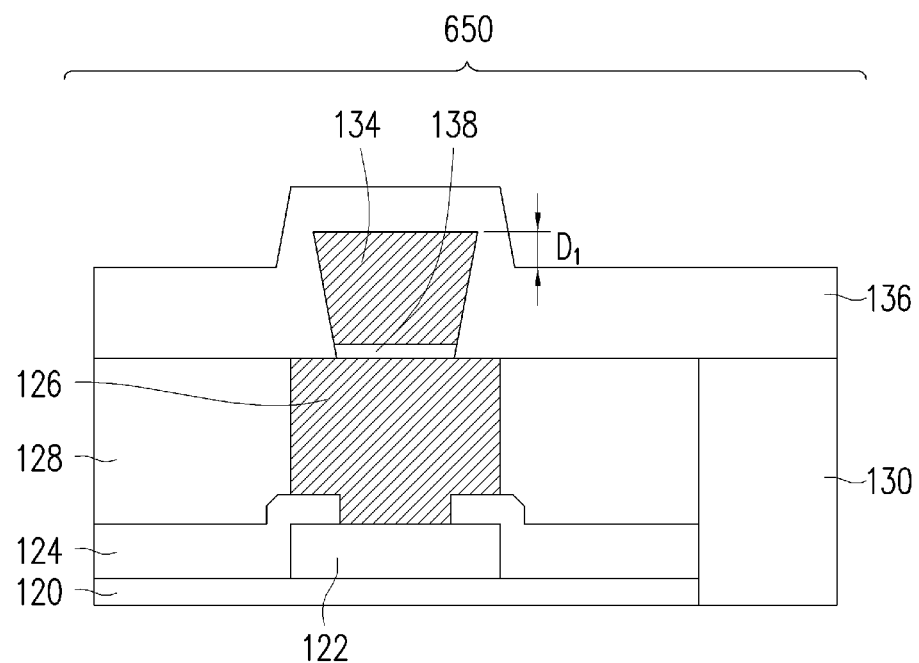

In FIG. 9C, the dielectric layer 136 is then deposited on the encapsulant 130, through vias 112, die connectors 126, and conductive vias 134. In some embodiments, the dielectric layer 136 is formed of a polymer, which may be a photo-sensitive material such as PBO, polyimide, BCB, or the like, that may be patterned using a lithography mask. In other embodiments, the dielectric layer 136 is formed of a nitride such as silicon nitride; an oxide such as silicon oxide, PSG, BSG, BPSG; or the like. The dielectric layer 136 may be formed by spin coating, lamination, CVD, the like, or a combination thereof. In particular, the dielectric layer 136 is conformally deposited over the conductive vias 134 such that the topmost surfaces of the conductive vias 134 extend a distance $D_1$ above a major surface of the dielectric layer 136. The distance $D_1$ may be from about 0.1 µm to about 0.5 µm. In other words, the dielectric layer 136 is "under-deposited" such that portions of the dielectric layer 136 between adjacent conductive vias 134 are recessed beneath top surfaces of the conductive vias 134.

Figure 9D:
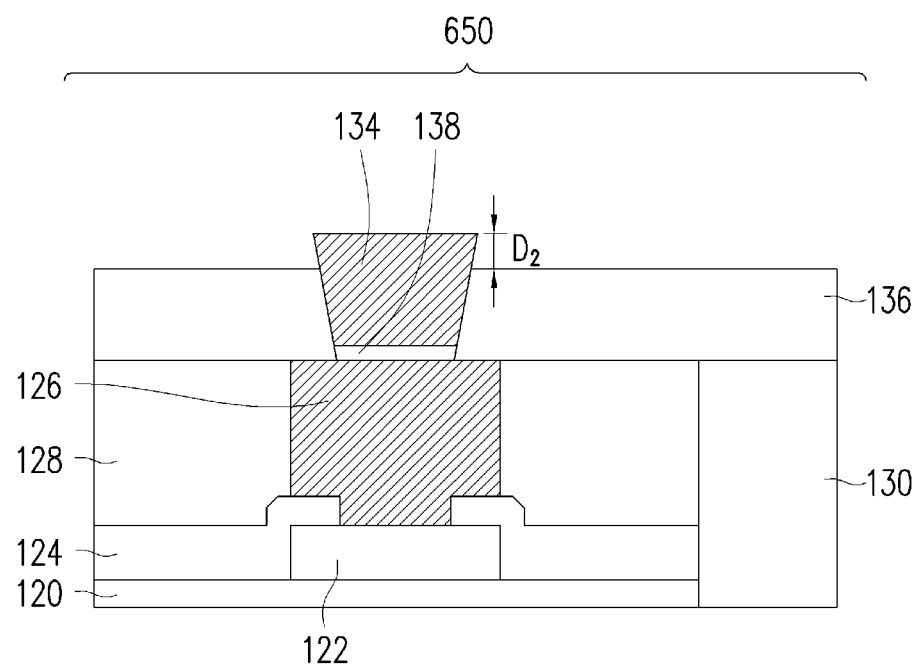

In FIG. 9D, a removal process is performed to remove portions of the dielectric layer 136, thereby exposing the conductive vias 134. The removal process thins the conductive vias 134 and the dielectric layer 136. After the removal process, the top surfaces of the conductive vias 134 extend a distance $D_2$ above the major surface of the dielectric layer 136, where the distance $D_2$ is less than the distance $D_1$. The distance $D_2$ may be from about 0.1 µm to about 0.3 µm. Performing the removal process after under-depositing the dielectric layer 136 may avoid the formation of blind vias (e.g., reduces chances of the conductive vias 134 remaining covered after the removal process).

In some embodiments, the removal process is a CMP, where parameters of the CMP are selected to cause dishing of the dielectric layer 136. Dishing may be introduced by selecting parameters of the CMP such as the pad, slurry, or downward pressure. A soft pad, such as a polyurethane (PU) polishing pad, may be used, causing the polishing to be more conformal. A slurry that is highly selective to the material of the dielectric layer 136, such as silica slurry, may be used, allowing the dielectric layer 136 to be removed at a higher rate than the conductive vias 134. For example, a slurry comprising milder chemical agents or abrasives may be used. Less downward pressure may be used, allowing the CMP to be more selective to the material of the dielectric layer 136, which may be an organic material that is quickly removed. For example, a downward pressure of from about 2 PSI to about 5 PSI may be used. By increasing the removal rate of the dielectric layer 136 compared to the conductive vias 134, dishing may be intentionally introduced, allowing the dielectric layer 136 to be recessed to the distance $D_2$ below the tops of the conductive vias 134.

In some embodiments, the removal process is a CMP followed by an etchback process. The parameters of the CMP are selected to avoid dishing of the dielectric layer 136. Dishing may be avoided by selecting the parameters of the CMP, described above, such that the removal rates of the conductive vias 134 and dielectric layer 136 are similar. After the CMP is performed, top surfaces of the conductive vias 134 and dielectric layer 136 are substantially level. The etchback process is then performed to thin the dielectric layer 136. The etchback process removes the dielectric layer 136 at a higher rate than the conductive vias 134. For example, the etchback process may be performed with a dry etching process using etchants that are selective to the organic material of the dielectric layer 136, such as $O_2$ in Ar.

Removing portions of the dielectric layer 136 over the conductive vias 134 may be faster than removing remaining portions of the dielectric layer 136 in a bulk planarization process. For example, in a same CMP process, the removal rate of the dielectric layer 136 at the protruding portions may be up to ten times faster than the removal rate of the dielectric layer 136 along major surfaces, particularly when the dielectric layer 136 experiences feature loading. As such, less planarization may be performed to expose the conductive vias 134 through the dielectric layer 136 and planarize the dielectric layer 136.

Figure 10:
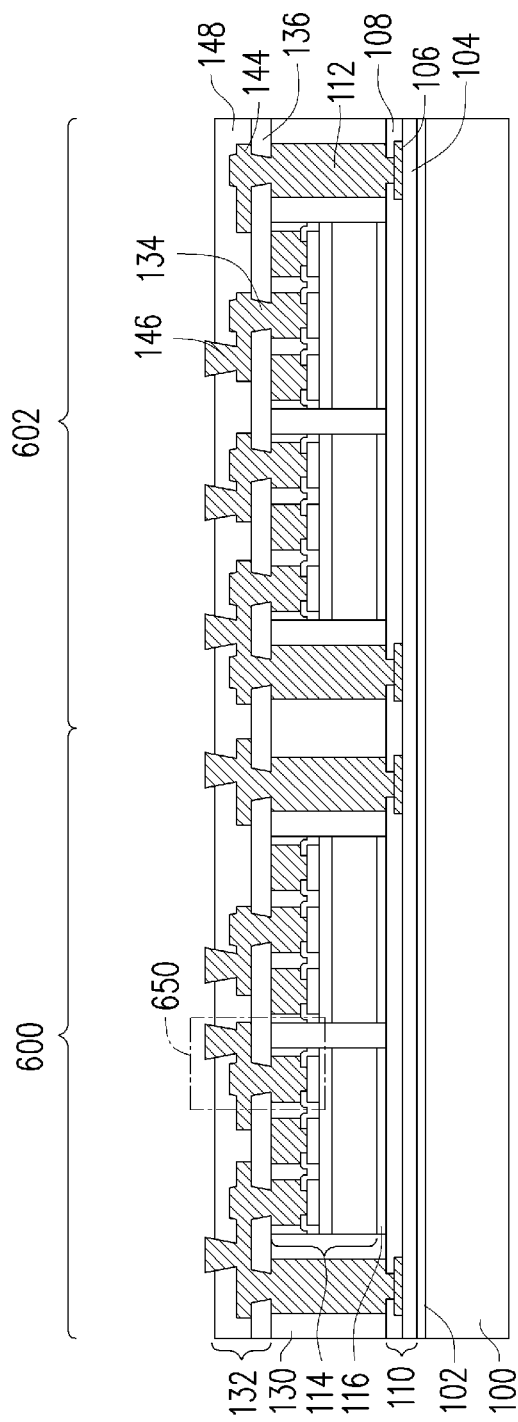

In FIG. 10, the conductive lines 144 are formed on the dielectric layer 136, electrically connected to the conductive vias 134. Next, the conductive vias 146 are formed electrically connected to the conductive lines 144. A dielectric layer 148 is then deposited on and around the conductive lines 144 and conductive vias 146. FIGS. 11A through 11G are cross-sectional views illustrating more details of the region 650 during a process for forming the conductive lines 144, conductive vias 146, and dielectric layer 148.

Figure 11A:
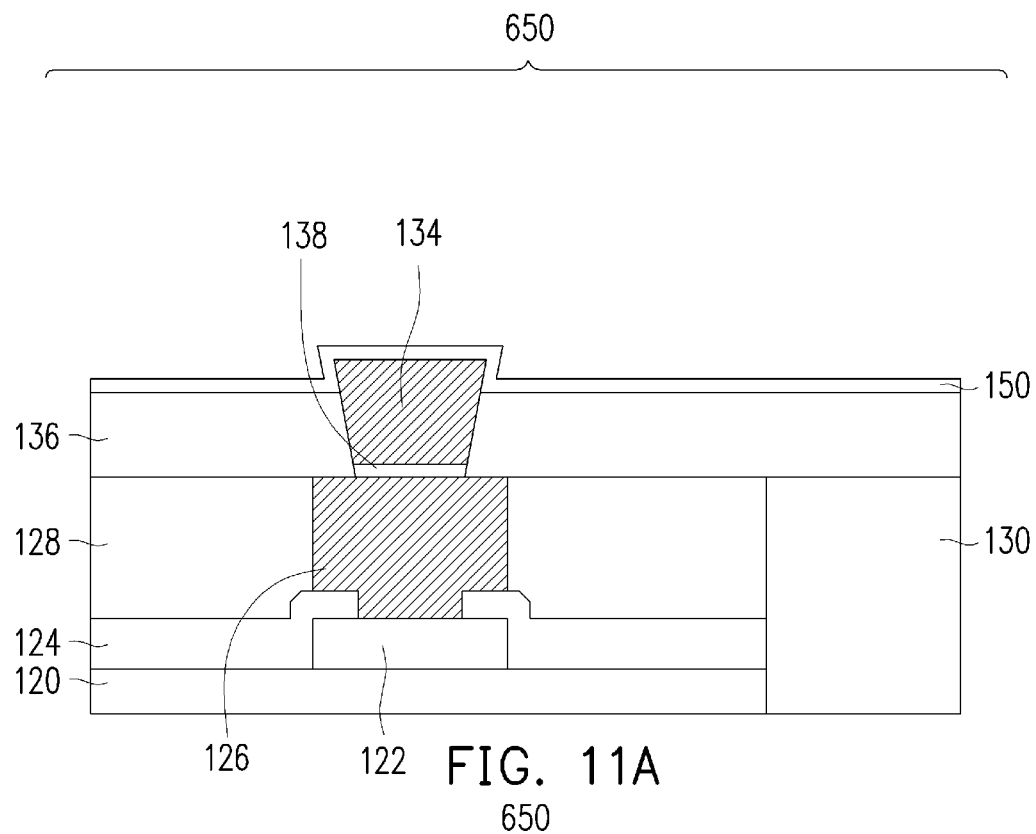

In FIG. 11A, a seed layer 150 is formed over the conductive vias 134 and dielectric layer 136. In particular, the seed layer 150 extends along the top surface of the dielectric layer 136, exposed sidewalls of the conductive vias 134, and top surfaces of the conductive vias 134. In some embodiments, the seed layer 150 is a metal layer, which may be a single layer or a composite layer comprising a plurality of sub-layers formed of different materials. In some embodiments, the seed layer 150 comprises a titanium layer and a copper layer over the titanium layer. The seed layer 150 may be formed using, for example, PVD or the like.

Figure 11B:
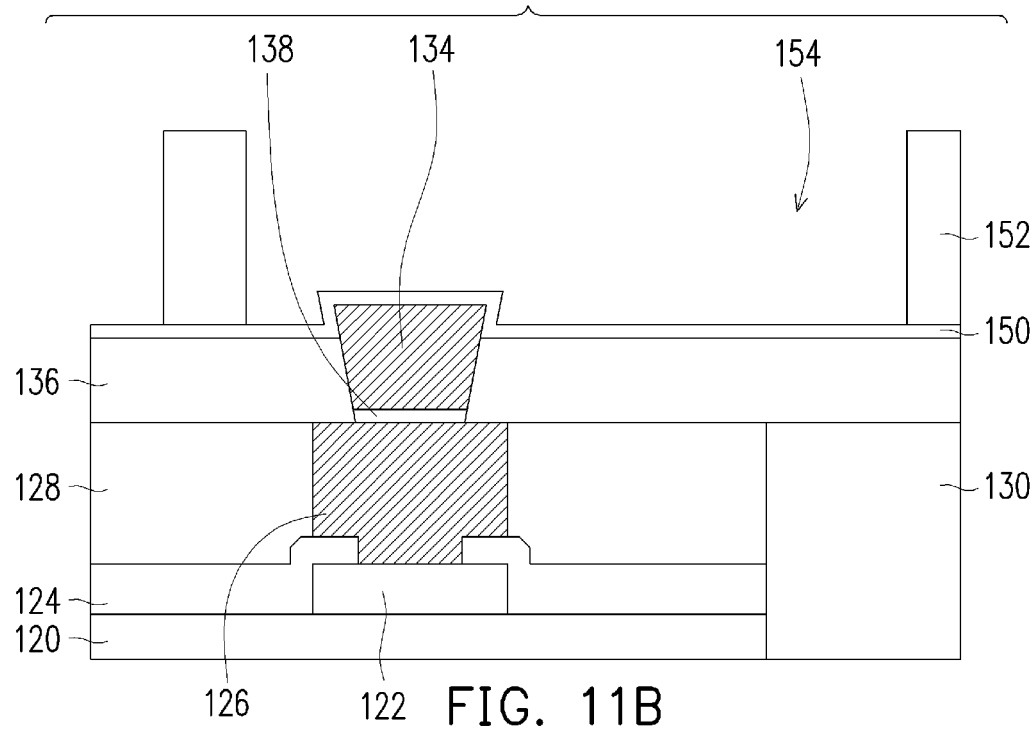

In FIG. 11B, a mask layer 152 is formed and patterned on the seed layer 150. The mask layer 152 may be a photo resist, such as a single-layer photo resist, tri-layer photo resist, or the like. The mask layer 152 may be formed by spin coating or the like and may be exposed to light for patterning. The pattern of the mask layer 152 corresponds to the conductive lines 144. The patterning forms openings 154 through the mask layer 152 to expose the seed layer 150. Because major surfaces of the underlying dielectric layer 136 are planar, the mask layer 152 may be formed to a substantially uniform thickness. As such, the mask layer 152 may develop more consistently, which may reduce the chances of residual mask layer 152 covering portions of the seed layer 150 in the openings 154.

Figure 11C:
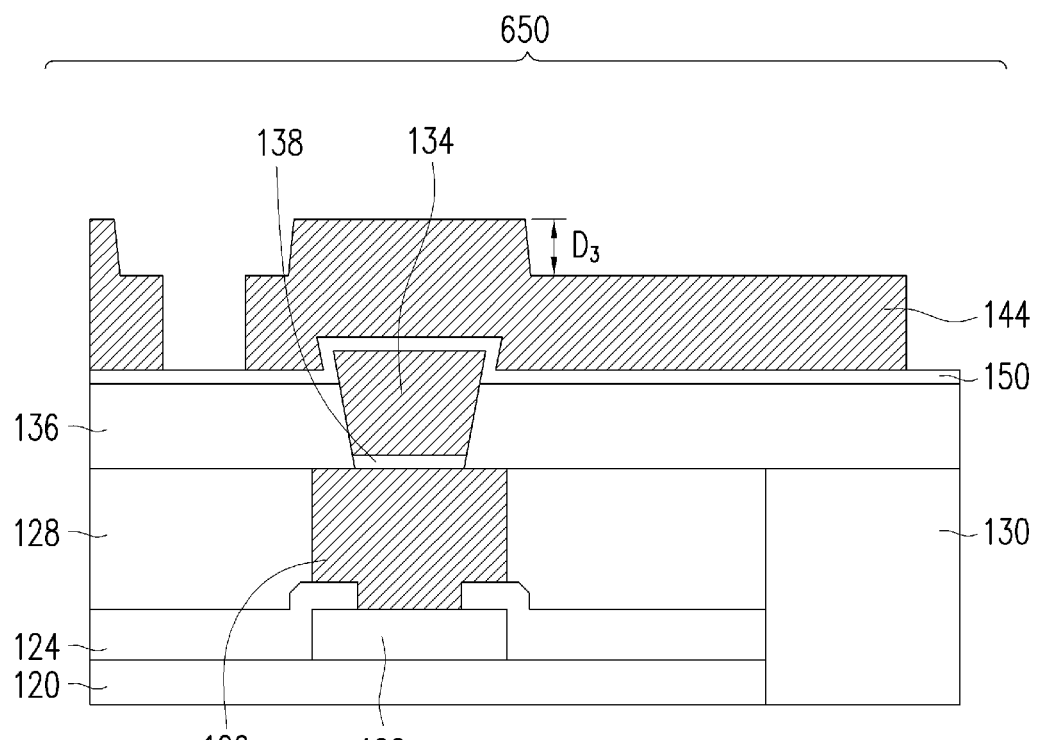

In FIG. 11C, a conductive material is formed in the openings 154 of the mask layer 152 and on the exposed portions of the seed layer 150. The conductive material may be formed by plating, such as electroplating or electroless plating, or the like. The conductive material may comprise a metal, like copper, titanium, tungsten, aluminum, or the like. Then, the mask layer 152 is removed. In embodiments where the mask layer 152 is a photo resist, it may be removed by an acceptable ashing or stripping process, such as using an oxygen plasma or the like. The conductive material and portions of the seed layer under the conductive material form the conductive lines 144. Because the conductive vias 134 extend above the dielectric layer 136, portions of the conductive lines 144 have a raised topology. The portions of the conductive lines 144 over the conductive vias 134 may have a convex shape, such that the top surfaces of the conductive lines 144 over the conductive vias 134 are raised a distance $D_3$ above the top surfaces of the conductive lines 144 not over the conductive vias 134. The distance $D_3$ may be from about 0 µm to about 0.2 µm. In other words, the conductive lines 144 do not have recesses over the conductive vias 134. In some embodiments, such as embodiments where the distance $D_2$ is small, the portions of the conductive lines 144 over the conductive vias 134 may not a convex shape, and may instead be substantially flat. After formation, the conductive vias 134 and seed layer 150 extend partially into respective ones of the conductive lines 144, thereby forming anchor connections between the conductive vias 134 and conductive lines 144.

Figure 11D:
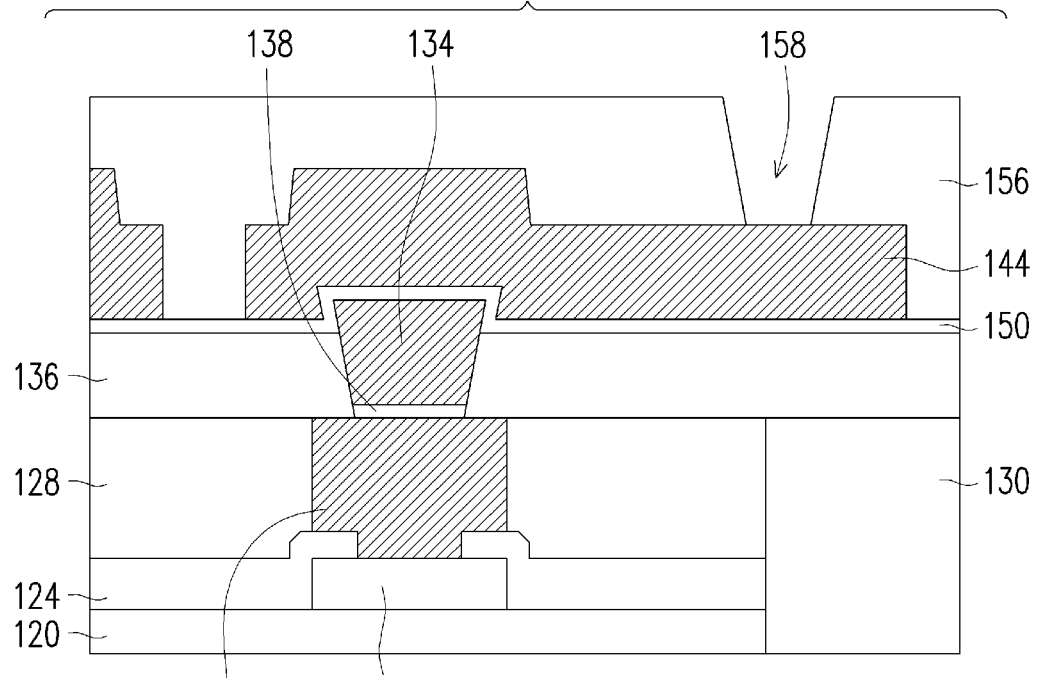

In FIG. 11D, a mask layer 156 is formed and patterned on the conductive lines 144 and seed layer 150. The mask layer 156 may be a photo resist, such as a single-layer photo resist, tri-layer photo resist, or the like. The mask layer 156 may be formed by spin coating or the like and may be exposed to light for patterning. The pattern of the mask layer 156 corresponds to the conductive vias 146. The patterning forms openings 158 through the mask layer 156 to expose portions of the conductive lines 144. Because major surfaces of the underlying dielectric layer 136 are planar, the mask layer 156 may be formed to a substantially uniform thickness. As such, the mask layer 156 may develop more consistently, which may reduce the chances of residual mask layer 156 covering portions of the conductive lines 144 in the openings 158.

Figure 11E:
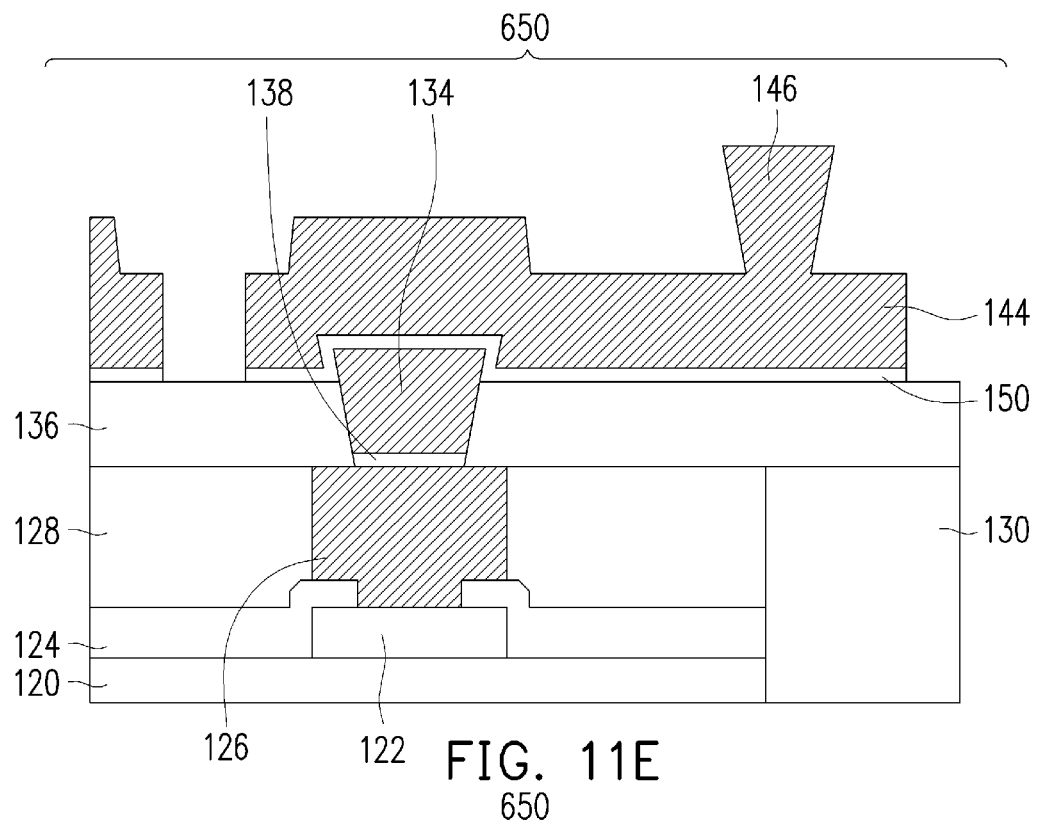

In FIG. 11E, a conductive material is formed in the openings 158 of the mask layer 156 and on the exposed portions of the conductive lines 144. The conductive material may be formed by plating, such as electroplating or electroless plating, or the like. The conductive material may comprise a metal, like copper, titanium, tungsten, aluminum, or the like.

Next, the mask layer 156 and portions of the seed layer 150 on which the conductive lines 144 are not formed are removed. In embodiments where the mask layer 156 is a photo resist, it may be removed by an acceptable ashing or stripping process, such as using an oxygen plasma or the like. Once the mask layer 156 is removed, exposed portions of the seed layer 150 are removed, such as by using an acceptable etching process, such as by wet or dry etching. The conductive material in the openings 158 forms the conductive vias 146.

Figure 11F:
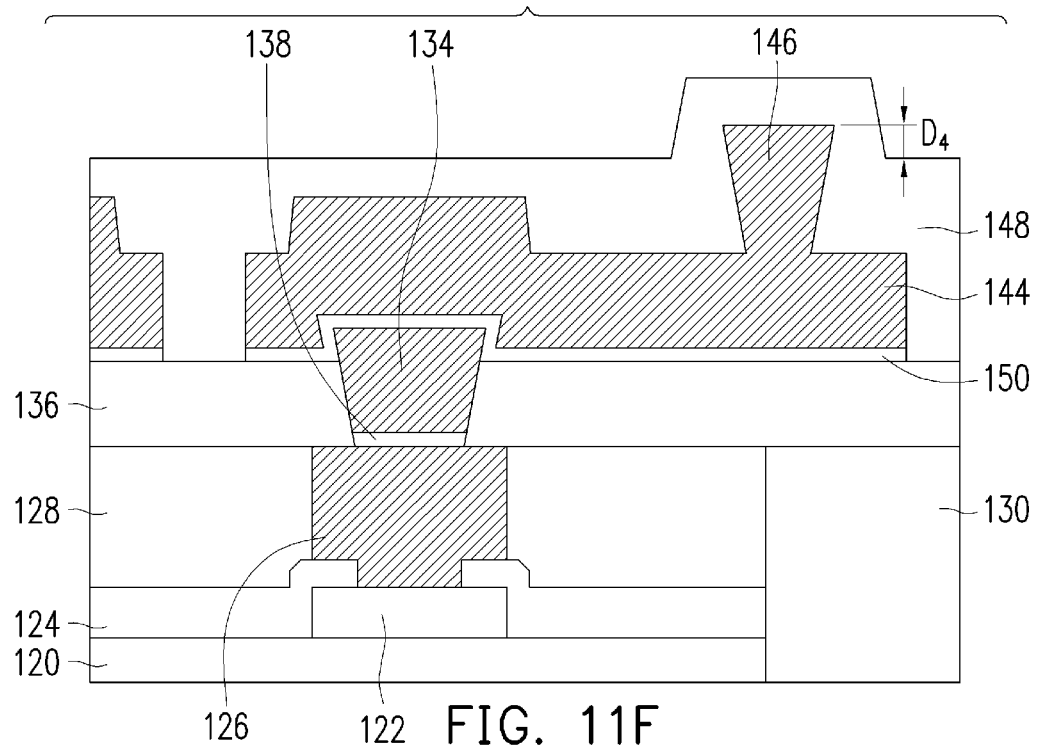

In FIG. 11F, the dielectric layer 148 is deposited on the dielectric layer 136, conductive lines 144, and conductive vias 146. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof. In particular, the dielectric layer 148 is conformally deposited over the conductive lines 144 and conductive vias 146 such that the topmost surfaces of the conductive vias 146 extend a distance $D_4$ above a major surface of the dielectric layer 148. The distance $D_4$ may be from about 0.1 μm to about 0.5 μm, and may be the same as the distance $D_1$. In other words, the dielectric layer 148 is under-deposited such that portions of the dielectric layer 148 between adjacent conductive vias 146 are recessed beneath top surfaces of the conductive vias 146.

Figure 11G:
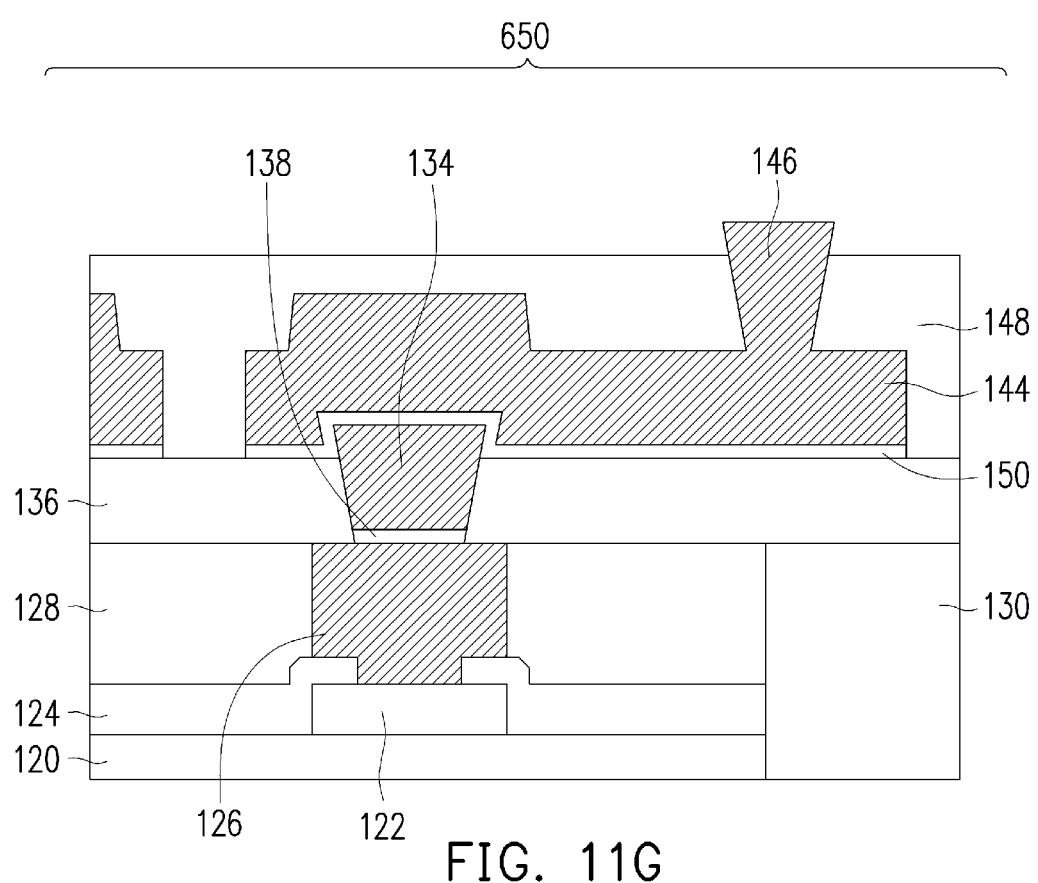

In FIG. 11G, a removal process is performed to remove portions of the dielectric layer 148, thereby exposing the conductive vias 146. The removal process thins the conductive vias 146 and the dielectric layer 148. The removal process may be similar to the removal process shown above in FIG. 9D.

Figure 12:
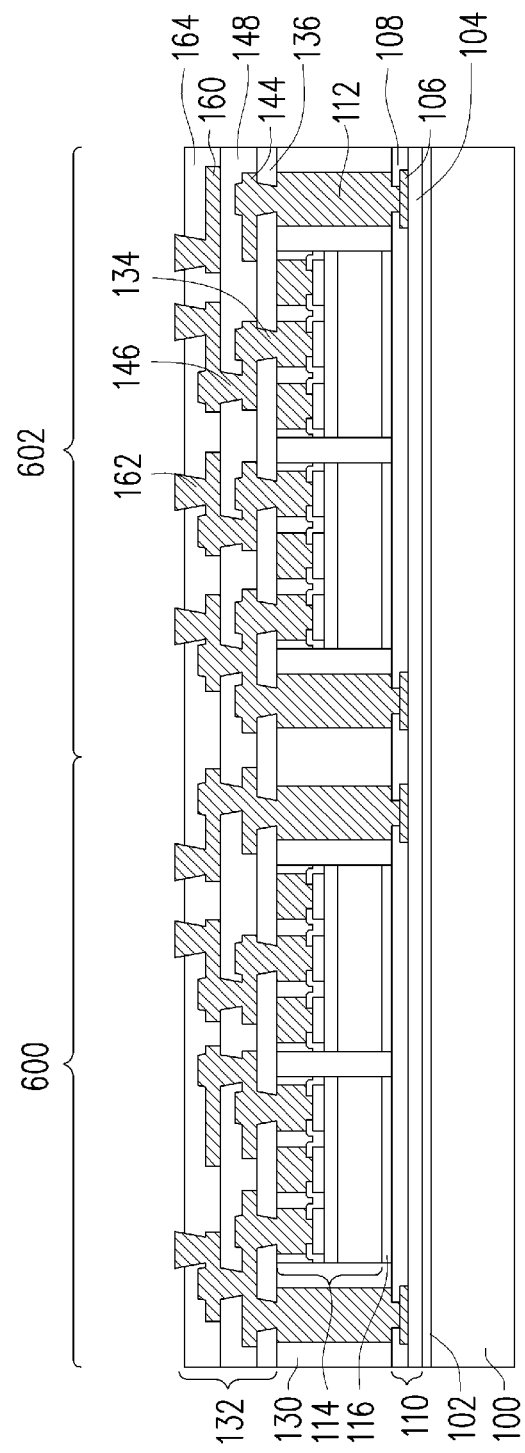

In FIG. 12, the conductive lines 160 are formed on the dielectric layer 148, electrically connected to the conductive vias 146. Next, the conductive vias 162 are formed electrically connected to the conductive lines 160. A dielectric layer 164 is then deposited on and around the conductive lines 160 and conductive vias 162. The conductive lines 160, conductive vias 162, and dielectric layer 164 may be formed in a similar manner as the conductive lines 144, conductive vias 146, and dielectric layer 148.

Figure 13:
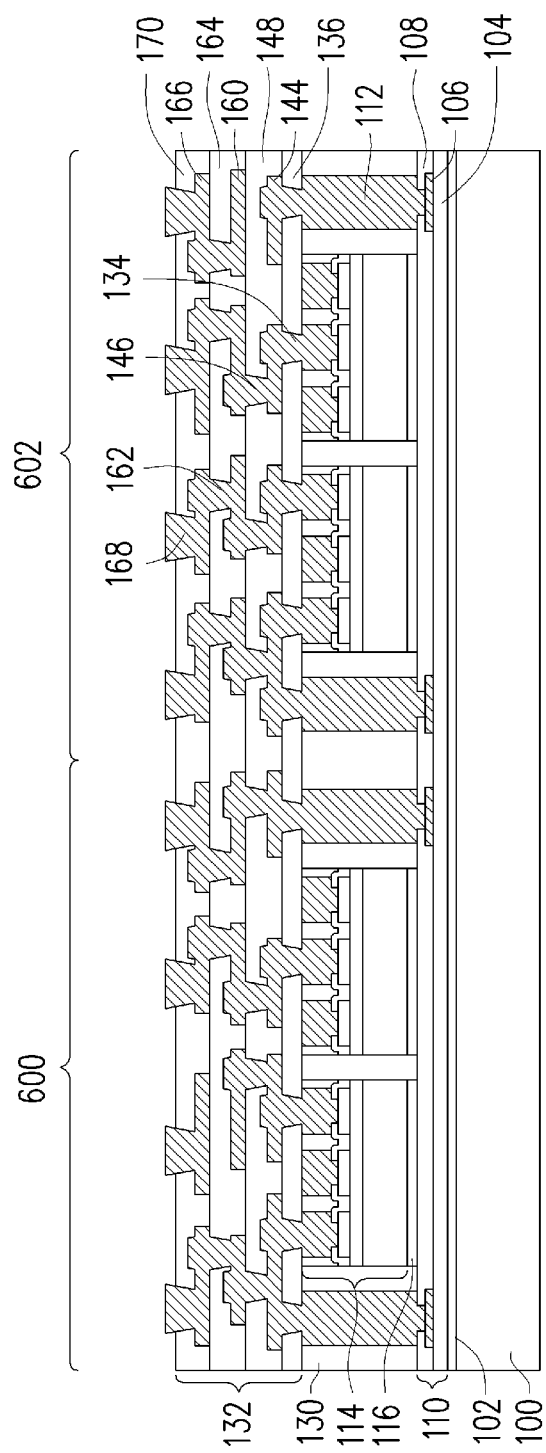

In FIG. 13, the conductive lines 166 are formed on the dielectric layer 164, electrically connected to the conductive vias 162. Next, the conductive vias 168 are formed electrically connected to the conductive lines 166. A dielectric layer 170 is then deposited on and around the conductive lines 166 and conductive vias 168. The conductive lines 166, conductive vias 168, and dielectric layer 170 may be formed in a similar manner as the conductive lines 144, conductive vias 146, and dielectric layer 148.

The front-side redistribution structure 132 is shown as an example. More or fewer dielectric layers, metallization patterns, and conductive vias may be formed in the front-side redistribution structure 132. If fewer dielectric layers, metallization patterns, or conductive vias are to be formed, steps and process discussed above may be omitted. If more dielectric layers, metallization patterns, and conductive vias are to be formed, steps and processes discussed above may be repeated. One having ordinary skill in the art will readily understand which steps and processes would be omitted or repeated.

Figure 14:
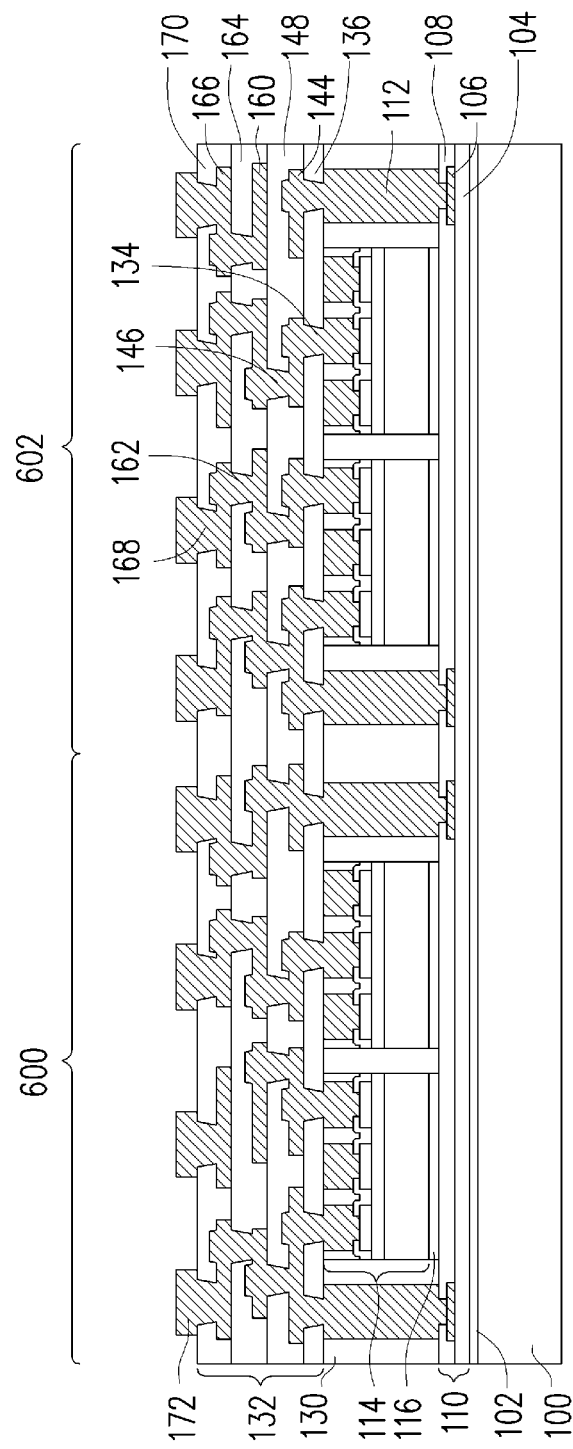

In FIG. 14, conductive pads 172 are formed on an exterior side of the front-side redistribution structure 132. The conductive pads 172 may be referred to as under bump metallurgies (UBMs). In the illustrated embodiment, the conductive pads 172 are formed electrically and physically coupled to the conductive vias 168. The conductive pads 172 are formed in a similar manner as the conductive lines 144, 160, 166, such that the conductive vias 168 extend into the conductive pads 172. As an example to form the conductive pads 172, a seed layer (not shown) is formed over the dielectric layer 170 and conductive vias 168, and on sidewalls of the conductive vias 168. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist (not shown) is then formed and patterned on the seed layer. The photo resist may be formed by spin coating or the like and may be exposed to light for patterning. The pattern of the photo resist corresponds to the conductive pads 172. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the conductive pads 172.

Figure 15:
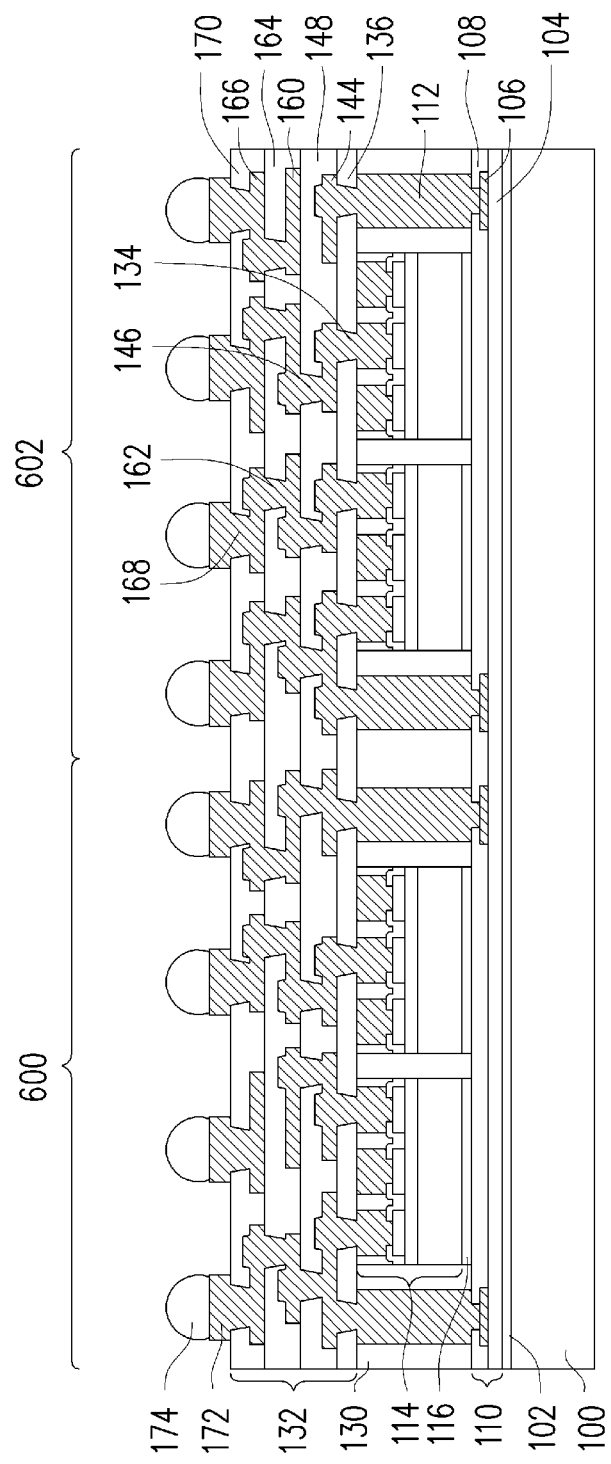

In FIG. 15, conductive connectors 174 are formed on the conductive pads 172. The conductive connectors 174 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 174 may include a conductive material such as solder, copper, aluminum, gold, nickel, silver, palladium, tin, the like, or a combination thereof. In some embodiments, the conductive connectors 174 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 174 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
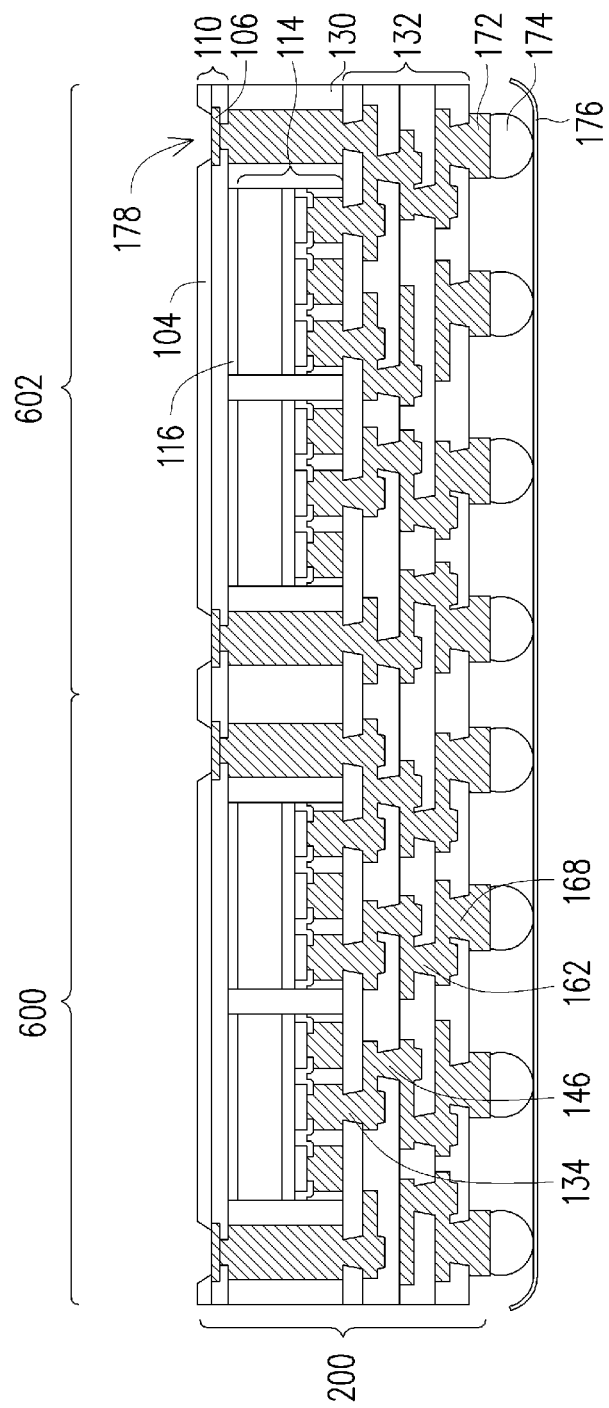

In FIG. 16, a carrier substrate de-bonding is performed to detach (de-bond) the carrier substrate 100 from the backside redistribution structure 110, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 176. Further, openings 178 are formed through the dielectric layer 104 to expose portions of the metallization pattern 106. The openings 178 may be formed, for example, using laser drilling, etching, or the like.

Figure 17:
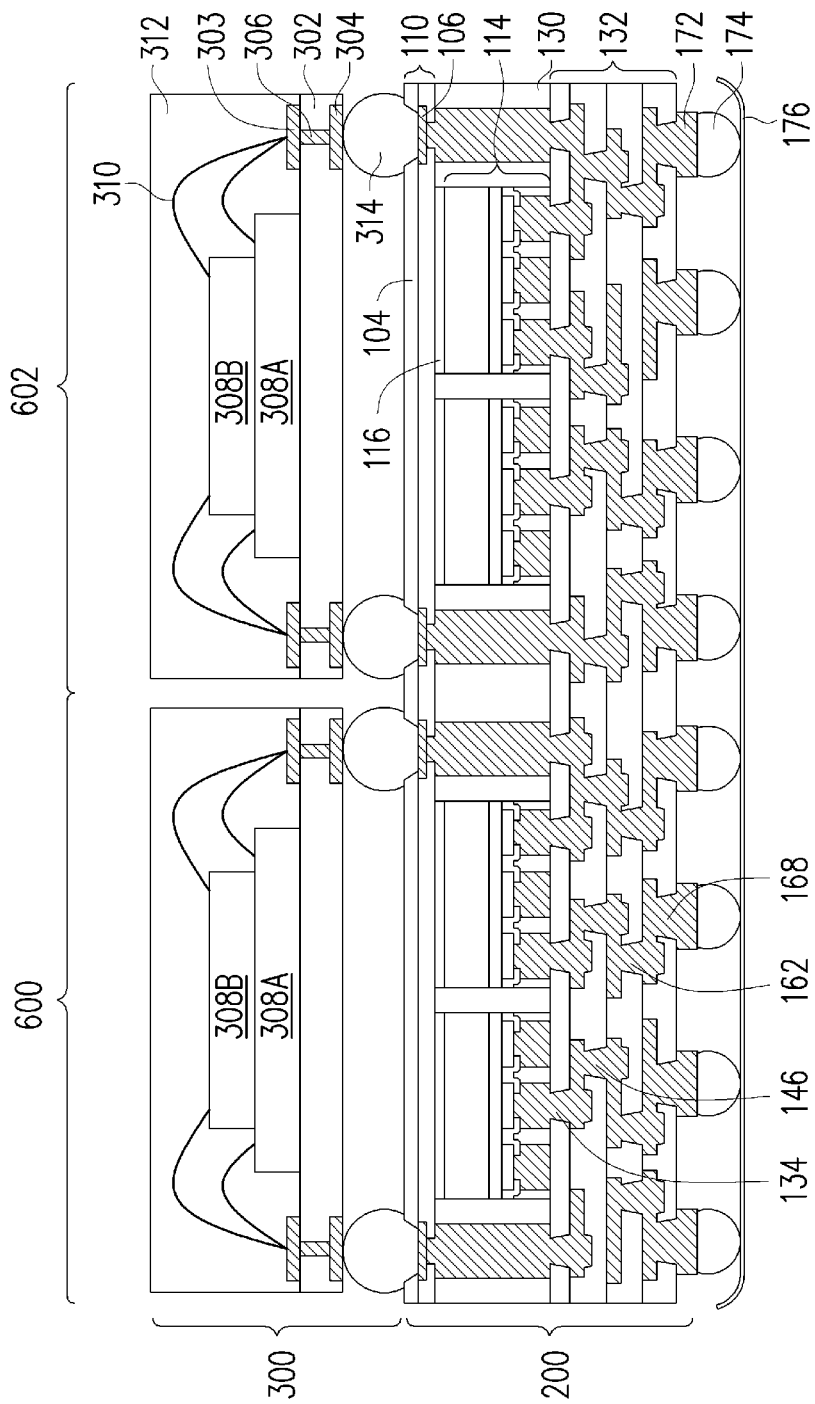
FIGS. 17 through 18 illustrate cross-sectional views of intermediate steps during a process for forming a package structure, in accordance with some embodiments.
Figure 18:
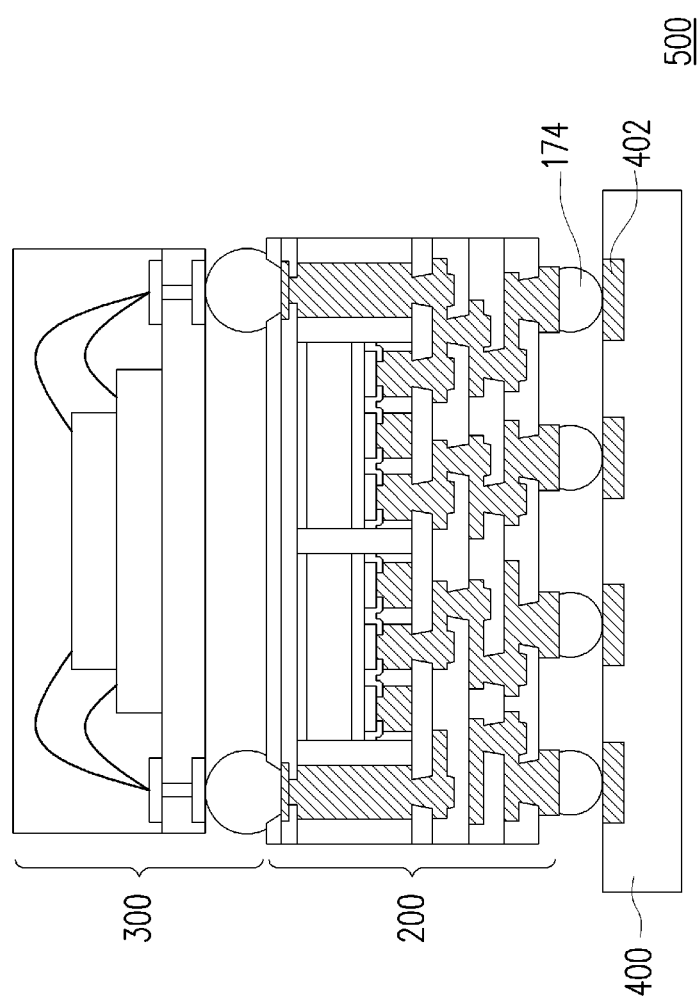

FIGS. 17 through 18 illustrate cross-sectional views of intermediate steps during a process for forming a package structure 500, in accordance with some embodiments. The package structure 500 may be referred to a package-on-package (PoP) structure.

In FIG. 17, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 174 described above and the description is not repeated herein, although the conductive connectors 314 and the conductive connectors 174 need not be the same. The conductive connectors 314 may be disposed on an opposing side of the substrate 302 as the stacked dies 308, in the openings 178. In some embodiments, a solder resist 318 may also be formed on the side of the substrate 302 opposing the stacked dies 308. The conductive connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization pattern 106.

In some embodiments, the conductive connectors 314 may have an optional epoxy flux (not shown) formed thereon before they are reflowed with at least some of the epoxy portion of the epoxy flux remaining after the second package 300 is attached to the first package 200.

An underfill (not shown) may be formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

The bonding between the second package 300 and the first package 200 may be a solder bonding. In an embodiment, the second package 300 is bonded to the first package 200 by a reflow process. During this reflow process, the conductive connectors 314 are in contact with the bond pads 304 and the metallization pattern 106 to physically and electrically couple the second package 300 to the first package 200. After the bonding process, an intermetallic compound (IMC, not shown) may form at the interface of the metallization pattern 106 and the conductive connectors 314 and also at the interface between the conductive connectors 314 and the bond pads 304 (not shown).

A singulation process is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process is performed after the second package 300 is attached to the first package 200. In other embodiments (not shown), the singulation process is performed before the second package 300 is attached to the first package 200, such as after the carrier substrate 100 is de-bonded and the openings 178 are formed.

In FIG. 18, the first package 200 is mounted to a package substrate 400 using the conductive connectors 174. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 174 are reflowed to attach the first package 200 to the bond pads 402. The conductive connectors 174 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 174.

The conductive connectors 174 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 174. In some embodiments, an underfill (not shown) may be formed between the first package 200 and the package substrate 400 and surrounding the conductive connectors 174. The underfill may be formed by a capillary flow process after the first package 200 is attached or may be formed by a suitable deposition method before the first package 200 is attached.

Embodiments may achieve advantages. Forming anchor connections between the conductive vias and metallization pattern may improve the mechanical strength of the interface between the conductive vias and metallization pattern, improving device reliability. Further, under-depositing dielectric layers over and around the conductive vias may allow the conductive vias to be more easily revealed through the dielectric layers, reducing the chances of forming blind vias, e.g., vias that are not fully exposed through the respective dielectric layer.

In an embodiment, a device includes: an integrated circuit die; a through via adjacent the integrated circuit die; a molding compound encapsulating the integrated circuit die and the through via; and a redistribution structure including: a first conductive via extending through a first dielectric layer, the first conductive via electrically connected to the integrated circuit die, the first dielectric layer being over the integrated circuit die, the through via, and the molding compound; and a first conductive line over the first dielectric layer and the first conductive via, the first conductive via extending into the first conductive line.

In some embodiments, a topmost surface of the first conductive via extends above a topmost surface of the first dielectric layer. In some embodiments, the first conductive line includes: a seed layer extending along the topmost surface of the first dielectric layer, sides of the first conductive via, and the topmost surface of the first conductive via; and a conductive material disposed on the seed layer. In some embodiments, the first conductive line has a first portion and a second portion, the first portion disposed over the first conductive via, a topmost surface of the first portion disposed further from the first dielectric layer than a topmost surface of the second portion. In some embodiments, the redistribution structure further includes: a second conductive via extending through a second dielectric layer, the second conductive via electrically connected to the first conductive line, the second dielectric layer being over the first dielectric layer and the first conductive line. In some embodiments, the device further includes: a conductive pad over the second dielectric layer and the second conductive via, the second conductive via extending into the conductive pad; and a conductive connectors on the conductive pad. In some embodiments, the device further includes: a first substrate connected to the conductive connectors; and a second substrate connected to the through via. In some embodiments, portions of the first conductive line over the first conductive via have a convex shape.

In an embodiment, a method includes: encapsulating an integrated circuit die with a molding compound, the integrated circuit die having a die connector; forming a first conductive via on the die connector of the integrated circuit die; depositing a first dielectric layer over the integrated circuit die, the molding compound, and the first conductive via, the first dielectric layer extending along sidewalls and a top surface of the first conductive via, the top surface of the first conductive via being above a major surface of the first dielectric layer; removing portions of the first dielectric layer on the sidewalls and the top surface of the first conductive via, thereby exposing a portion of the first conductive via; and forming a first conductive line on the first dielectric layer and the exposed portion of the first conductive via.

In some embodiments, the removing the portions of the first dielectric layer includes: performing a planarization process on the first dielectric layer, the sidewalls and the top surface of the first conductive via being exposed after the planarization process. In some embodiments, the planarization process is performed with a downward pressure of from 2 PSI to 5 PSI until the exposed portion of the first conductive via extends above the major surface of the first dielectric layer a distance of from 0.1 m to 0.5 m. In some embodiments, the removing the portions of the first dielectric layer includes: performing a planarization process on the first dielectric layer and the first conductive via, top surfaces of the first dielectric layer and the first conductive via being level; and performing an etching process on the first dielectric layer, the sidewalls and the top surface of the first conductive via being exposed after the etching process. In some embodiments, the first dielectric layer is an organic dielectric material, and the etching process is a dry etching process performed with $O_2$ in Ar. In some embodiments, portions of the first conductive line over the first conductive via have a convex shape. In some embodiments, portions of the first conductive line over the first conductive via have a flat shape.

In an embodiment, a method includes: placing an integrated circuit die on a first dielectric layer, the integrated circuit die having a die connector; encapsulating the integrated circuit die with a molding compound; forming a first conductive via on the die connector of the integrated circuit die, the first conductive via having a topmost surface disposed a first distance from the first dielectric layer; depositing a second dielectric layer on the integrated circuit die, the molding compound, and the first conductive via, the second dielectric layer having a major surface disposed a second distance from the first dielectric layer, the first distance being greater than the second distance; removing portions of the first dielectric layer to expose sides and the topmost surface of the first conductive via; and forming a first conductive line on the first conductive via, the first conductive line contacting the sides and the topmost surface of the first conductive via.

In some embodiments, the forming the first conductive via includes: depositing a first seed layer on the integrated circuit die and the molding compound; forming a first mask layer on the first seed layer; patterning a first opening in the first mask layer; plating a first conductive material in the first opening; and removing the first mask layer and exposed portions of the first seed layer, the first conductive material and remaining portions of the first seed layer forming the first conductive via. In some embodiments, the forming the first conductive line includes: depositing a second seed layer on the second dielectric layer and on the sides and the topmost surface of the first conductive via; forming a second mask layer on the second seed layer; patterning a second opening in the second mask layer over the first conductive via; and plating a second conductive material from the second seed layer in the second opening, the second conductive material and portions of the second seed layer underlying the second conductive material forming the first conductive line. In some embodiments, the method further includes: forming a third mask layer on the second conductive material and the second seed layer; patterning a third opening in the third mask layer over the second conductive material; plating a third conductive material from the second conductive material in the third opening; removing the third mask layer and exposed portions of the second seed layer, the third conductive material and remaining portions of the second seed layer forming a second conductive via; and depositing a third dielectric layer on the second dielectric layer, the first conductive line, and the second conductive via. In some embodiments, portions of the first conductive material over the first conductive via have a convex shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating an integrated circuit die with a molding compound, the integrated circuit die having a die connector;
   forming a first conductive via on the die connector of the integrated circuit die;
   depositing a first dielectric layer over the integrated circuit die, the molding compound, and the first conductive via, the first dielectric layer having a first portion and a second portion, the first portion extending along a top surface of the molding compound, the second portion extending along sidewalls and a top surface of the first conductive via, the first portion having a first top surface, the second portion having a second top surface, the second top surface of the second portion being above the top surface of the first conductive via, the top surface of the first conductive via being above the first top surface of the first portion;
   removing the second portion of the first dielectric layer from the sidewalls and the top surface of the first conductive via, thereby exposing the top surface and the sidewalls of the first conductive via; and
   forming a first conductive line on the first dielectric layer, the exposed top surface of the first conductive via, and the exposed sidewalls of the first conductive via.

2. The method of claim 1, wherein the removing the second portion of the first dielectric layer comprises:
   performing a planarization process on the first dielectric layer, the sidewalls and the top surface of the first conductive via being exposed after the planarization process.

3. The method of claim 2, wherein the planarization process is performed with a downward pressure of from 2 PSI to 5 PSI until the exposed top surface of the first conductive via extends above the first top surface of the first dielectric layer a distance of from 0.1 µm to 0.5 µm.

4. The method of claim 1, wherein the removing the second portion of the first dielectric layer comprises:
   performing a planarization process on the first dielectric layer and the first conductive via, top surfaces of the first dielectric layer and the first conductive via being level; and
   performing an etching process on the first dielectric layer, the sidewalls and the top surface of the first conductive via being exposed after the etching process.

5. The method of claim 4, wherein the first dielectric layer is an organic dielectric material, and wherein the etching process is a dry etching process performed with $O_2$ in Ar.

6. The method of claim 1, wherein portions of the first conductive line over the first conductive via have a convex shape.

7. The method of claim 1, wherein portions of the first conductive line over the first conductive via have a flat shape.

8. A method comprising:
   placing an integrated circuit die on a first dielectric layer, the integrated circuit die having a die connector;
   encapsulating the integrated circuit die with a molding compound;
   forming a first conductive via on the die connector of the integrated circuit die, the first conductive via having a first top surface disposed a first distance from the first dielectric layer;
   depositing a second dielectric layer on the integrated circuit die, the molding compound, and the first conductive via, the second dielectric layer having a second top surface over the molding compound and a third top surface over the first conductive via, the second top surface disposed a second distance from the first dielectric layer, the third top surface disposed a third distance from the first dielectric layer, the first distance being greater than the second distance, the first distance being less than the third distance;
   removing portions of the second dielectric layer to expose sides and the first top surface of the first conductive via; and
   forming a first conductive line on the first conductive via, the first conductive line contacting the exposed sides and the exposed first top surface of the first conductive via.

9. The method of claim 8, wherein the forming the first conductive via comprises:
   depositing a first seed layer on the integrated circuit die and the molding compound;
   forming a first mask layer on the first seed layer;
   patterning a first opening in the first mask layer;
   plating a first conductive material in the first opening; and
   removing the first mask layer and exposed portions of the first seed layer, the first conductive material and remaining portions of the first seed layer forming the first conductive via.

10. The method of claim 9, wherein the forming the first conductive line comprises:
    depositing a second seed layer on the second top surface of the second dielectric layer, the exposed sides of the first conductive via, and the exposed first top surface of the first conductive via;
    forming a second mask layer on the second seed layer;
    patterning a second opening in the second mask layer over the first conductive via; and
    plating a second conductive material from the second seed layer in the second opening, the second conductive material and portions of the second seed layer underlying the second conductive material forming the first conductive line.

11. The method of claim 10, further comprising:
    forming a third mask layer on the second conductive material and the second seed layer;
    patterning a third opening in the third mask layer over the second conductive material;
    plating a third conductive material from the second conductive material in the third opening;
    removing the third mask layer and exposed portions of the second seed layer, the third conductive material and remaining portions of the second seed layer forming a second conductive via; and depositing a third dielectric layer on the second dielectric layer, the first conductive line, and the second conductive via.

12. The method of claim 10, wherein portions of the first conductive material over the first conductive via have a convex shape.

13. A method comprising:

encapsulating an integrated circuit die and a through via with a molding compound, the integrated circuit die having a die connector;

forming a first conductive via on the die connector of the integrated circuit die;

forming a second conductive via on the through via;

depositing a first dielectric layer having a first portion, a second portion, and a third portion, the first portion disposed on first sidewalls and a first top surface of the first conductive via, the second portion disposed on second sidewalls and a second top surface of the second conductive via, the third portion disposed between the first conductive via and the second conductive via, the third portion being recessed beneath the first top surface and the second top surface;

removing the first portion and the second portion of the first dielectric layer; and after the removing, forming a conductive line on the first sidewalls and the first top surface of the first conductive via, the second sidewalls and the second top surface of the second conductive via, and the third portion of the first dielectric layer.

14. The method of claim 13, wherein removing the first portion and the second portion of the first dielectric layer comprises planarizing the first dielectric layer.

15. The method of claim 14, wherein removing the first portion and the second portion of the first dielectric layer further comprises etching the first dielectric layer after planarizing the first dielectric layer.

16. The method of claim 13, wherein forming the conductive line comprises:

depositing a seed layer on the first sidewalls and the first top surface of the first conductive via, the second sidewalls and the second top surface of the second conductive via, and the third portion of the first dielectric layer;

forming a mask on the seed layer, the mask having an opening exposing portions of the seed layer; and plating the conductive line from the portions of the seed layer exposed by the opening of the mask.

17. The method of claim 13 further comprising:

forming a third conductive via on the conductive line; and depositing a second dielectric layer on third sidewalls and a third top surface of the third conductive via.

18. The method of claim 17, wherein forming the third conductive via comprises:

forming a mask on the conductive line, the mask having an opening exposing portions of the conductive line; and plating the third conductive via from the portions of the conductive line exposed by the opening of the mask.

19. The method of claim 17, wherein portions of the conductive line on the first conductive via and the second conductive via have convex shapes.

20. The method of claim 17, wherein portions of the conductive line on the first conductive via and the second conductive via have flat shapes.

* * * * *